United States Patent
Thompson et al.

(12)

(10) Patent No.: US 6,334,453 B1
(45) Date of Patent: *Jan. 1, 2002

(54) SEAL CONFIGURATION FOR USE WITH A MOTOR DRIVE ASSEMBLY IN A MICROELECTRONIC WORKPIECE PROCESSING SYSTEM

(75) Inventors: Raymon F. Thompson; Scott Bruner, both of Kalispell, MT (US)

(73) Assignee: Semitool, Inc.

( * ) Notice: Subject to any disclaimer, the term of this patent is extended or adjusted under 35 U.S.C. 154(b) by 0 days.

This patent is subject to a terminal disclaimer.

(21) Appl. No.: 09/503,784

(22) Filed: Feb. 14, 2000

(51) Int. Cl.[7] ................................. B08B 13/00
(52) U.S. Cl. ................... 134/140; 134/157; 134/902
(58) Field of Search ................... 134/902, 140, 134/153, 157, 159; 156/345 L, 345 LS (56) References Cited

U.S. PATENT DOCUMENTS 5,022,419 A * 6/1991 Thompson et al. ..... 134/902 X
6,098,641 A * 8/2000 Owczarz ................ 134/902 X

* cited by examiner

*Primary Examiner*—Philip R. Coe
(74) *Attorney, Agent, or Firm*—Polit & Associates (57) ABSTRACT

An apparatus for processing a microelectronic workpiece, such as a semiconductor wafer, is set forth. The apparatus comprises a processing bowl that defines a processing chamber. A seal is provided to assist in removing fluids, such as processing fluids, from the processing chamber that are in the proximity of the seal. Further, the seal is provided to assist in preventing the fluids from entering the motor. To this end, flow generating threads and expulsion threads are provided at an end of a shaft assembly that is connected to be driven by the motor. A member substantially surrounds at least a portion of the flow generating threads and at least a portion of the expulsion threads. Together, the member defines a chamber with the shaft assembly. Rotation of the shaft assembly results in corresponding rotation of the flow generating threads and expulsion threads to drive fluids proximate the shaft assembly to an exhaust while concurrently assisting in preventing such fluids from entering the motor.

33 Claims, 7 Drawing Sheets

SEAL CONFIGURATION FOR USE WITH A MOTOR DRIVE ASSEMBLY IN A MICROELECTRONIC WORKPIECE PROCESSING SYSTEM

CROSS-REFERENCE TO RELATED APPLICATIONS

None

BACKGROUND OF THE INVENTION

This invention relates to an apparatus for processing microelectronic workpieces, such as semiconductor workpieces, glass photomask plates, memory media workpieces, workpieces used in the formation of micromechanical devices and/or components, etc. More particularly, the invention is directed to a seal arrangement for use in a microelectronic workpiece processing system that assists in improving the workpiece processing yield.

In the production of integrated circuits and other microelectronic components, etc., the microelectronic workpieces undergo multiple processing steps. The basic material for the workpiece substrates may be silicon, glass, ceramic materials of various sorts or other similar materials of very thin waferlike configuration. This basic substrate is subjected to coating, etching, and cleaning processes and it is extremely important that each processing step is performed with the greatest possible yield thereby lowering production costs.

Microelectronic workpieces have been processed by spinning them about a vertical axis where the wafers or masks are stacked vertically as described in U.S. Pat. No. 3,760,822 with various holding mechanisms such as vacuum chucks. This has led to further disadvantages where the workpiece may be only processed on one side at a time without a significantly different processing rate, wherein the topside processes at a much faster rate than that of the underside.

Other processing devices such as described in U.S. Pat. No. 3,970,471, process each wafer individually. Although the wafer is rotated about a horizontal axis, such a device can only process a single wafer at each station which may be expensive and time consuming.

To eliminate many of the problems noted above, the assignee of the present invention developed a wafer processing system and set forth and claimed the system in U.S. Pat. No. 4,300,581, titled "Centrifugal Wafer Processor", issued Nov. 17, 1981. The invention set forth therein permits the processing of a plurality of wafers at the same time in a carrier. In accordance with that invention, microelectronic workpieces are processed by inserting them into the carrier and placing the carrier in a rotor, which rotates around a substantially horizontal axis (although disposed at a slight angle). Various processing fluids may be applied to the workpieces uniformly through the spray nozzles while the workpieces are being rotated.

The foregoing system includes built-in shock absorbers that extend vertically from a frame that supports a bowl into which the carrier is inserted. The shock absorbers assist in reducing the transfer of vibrational energy to the carrier. The reduction of vibration energy transfer facilitates a greater processing yield since the workpieces are not subject to damaging mechanical stresses and strains. The present inventors have recognized a further manner in which to reduce the vibration energy transfer using a direct drive motor assembly having one or more shock absorbing structures associated therewith. A still further problem present in the prior apparatus is the sealing of the motor to isolate it from exposure to materials, such as processing fluids. The present inventors have provided a unique solution to this problem by providing a seal about the rotor of the motor.

BRIEF SUMMARY OF THE INVENTION

An apparatus for processing a microelectronic workpiece, such as a semiconductor wafer, is set forth. The apparatus comprises a processing bowl that defines a processing chamber. A seal is provided to assist in removing fluids, such as processing fluids, from the processing chamber that are in the proximity of the seal. Further, the seal is provided to assist in preventing the fluids from entering the motor. To this end, flow generating threads and expulsion threads are provided at an end of a shaft assembly that is connected to be driven by the motor. A member substantially surrounds at least a portion of the flow generating threads and at least a portion of the expulsion threads. Together, the member defines a chamber with the shaft assembly. Rotation of the shaft assembly results in corresponding rotation of the flow generating threads and expulsion threads to drive fluids proximate the shaft assembly to an exhaust while concurrently assisting in preventing such fluids from entering the motor.

DETAILED DESCRIPTION OF THE INVENTION

Figure 1:
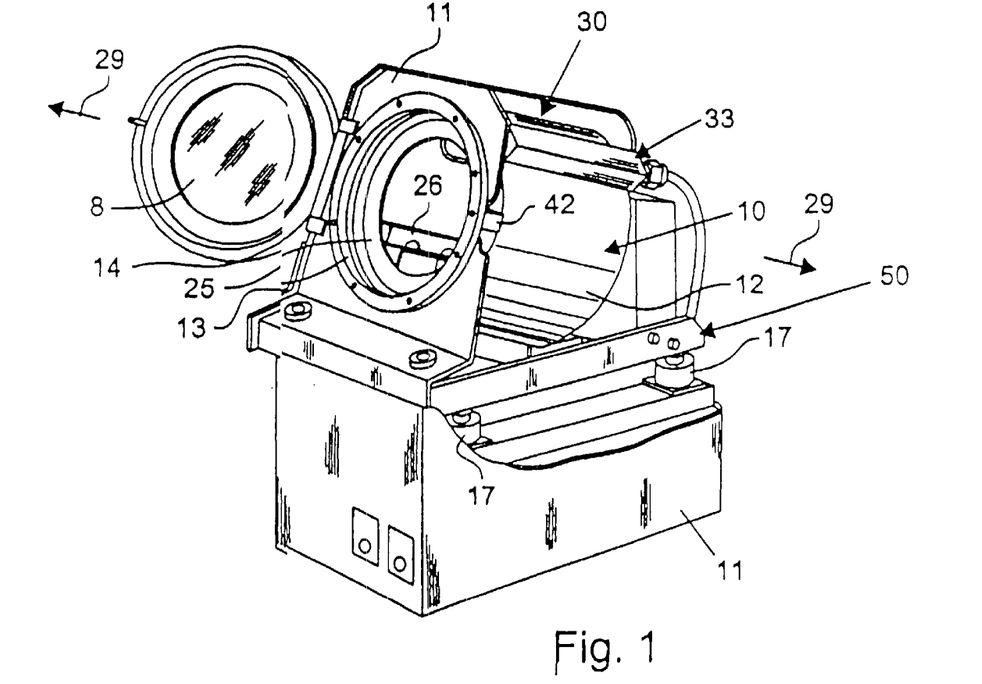
FIG. 1 is a perspective view of one embodiment of a microelectronic workpiece processing apparatus that may employ the motor mount and seal of the present invention.

Referring now to the drawings, an exemplary apparatus 10 for processing workpieces, such as semiconductor wafers, is illustrated in FIG. 1. This apparatus is merely one type of microelectronic workpiece processing apparatus in which the direct motor drive of the present invention may be used. Another similar processing apparatus that may employ the direct motor drive of the present invention is set forth in U.S. Pat. No. 5,022,419, titled "Rinser Dryer System", issued Jun. 11, 1991, and assigned to the assignee of the present invention. The teachings of both the '581 and '419 patent are incorporated by reference.

The exemplary apparatus 10, as shown in FIG. 1. has a somewhat a rectangular outer configuration and a front opening. This style of apparatus is sometimes referred to as a front-loading processor, indicative of the manner in which semiconductor wafers are placed into the apparatus. The apparatus 10 includes a frame and cabinet assembly, shown generally at 11, which houses a stationary bowl 12 with a front opening 13. A hinged door 14 on the frame is arranged to seal with respect to the opening 13 so that the bowl and door provide an enclosed processing chamber. Bowl 12 is preferably constructed of corrosion and solvent resistant material such as stainless steel, and is cylindrically shaped with a drain at the bottom for removal of processing fluids during the processing cycles.

A carrier rotor 15 is concentrically arranged within bowl 12. The carrier rotor includes support members 26, support rod 28, and support ring 25. Carrier rotor 15 is supported within bowl 12 for rotation about a rotation axis 29 in a known manner.

Figure 3:
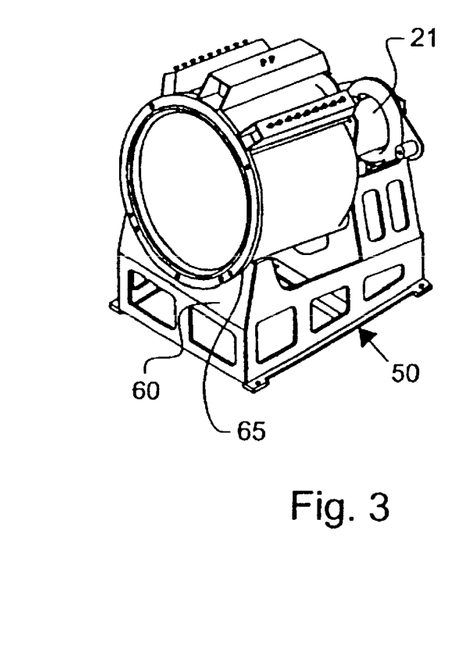
FIG. 3 is a perspective view of one embodiment of a bowl, motor assembly, and frame used in the apparatus of FIG. 1.

FIG. 3 shows the principal operational components of the upper section 30 of the apparatus 10 with various cabinet panels remove. In the illustrated embodiment, the carrier rotor 15 (not shown in FIG. 3) is either directly or indirectly coupled to an electrically driven motor assembly 21 that has a rotor shaft having an axis of rotation 31 (see FIG. 4) coinciding with the axis of rotation 29 of carrier rotor 15 (see FIG. 1) when the apparatus is assembled. The motor assembly 21 provides a controlled rotational driving of carrier rotor 15 within bowl 12.

Figure 2:
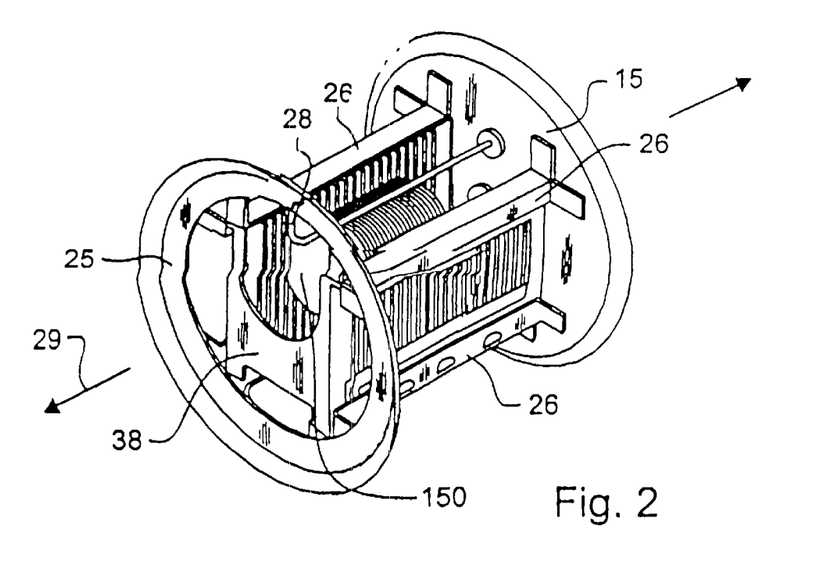
FIG. 2 is a wafer carrier shaft assembly for use in the apparatus of FIG. 1.
Figure 4:
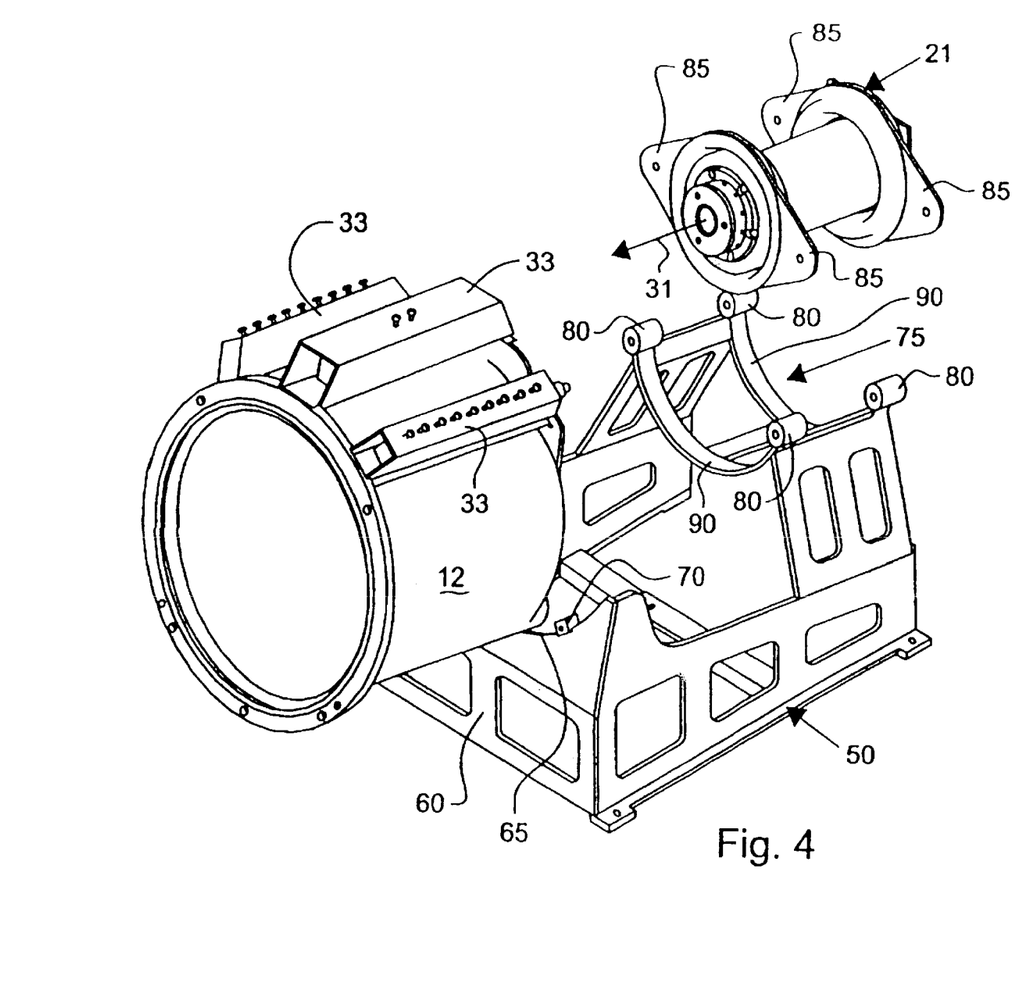
FIG. 4 is an exploded view of the components of FIG. 3.

As illustrated in FIGS. 3 and 4, bowl 12 is stationary and is connected to frame 50. In some systems, the frame 50 may be vibrationally supported by shock absorbers 17 (FIG. 1) within cabinet 55. The bowl 12 is provided with a plurality of spray members 33 that are disposed above and parallel to support members 26 of carrier rotor 15 to direct processing fluids toward wafers supported in the processing chamber by the carrier 38. Support member 26 and support rod 28 are coupled to support ring 25 as shown in FIG. 2, providing the outer support for carrier 38.

Referring again to FIGS. 3 and 4, frame 50 includes a front end 60 having a cutout 65 with attaching lugs 70 for securement with the bowl 12. The frame 50 further includes a motor support sub-frame 75 that is shaped to accept the electrically driven motor assembly 21. The motor support sub-frame 75 includes lugs 80 that provide means for securement with outer flange members 85 of the motor assembly 21 and concave cutout sections 90 that allow portions of the motor assembly 21 to fit within frame 50.

Figures 5, 6:
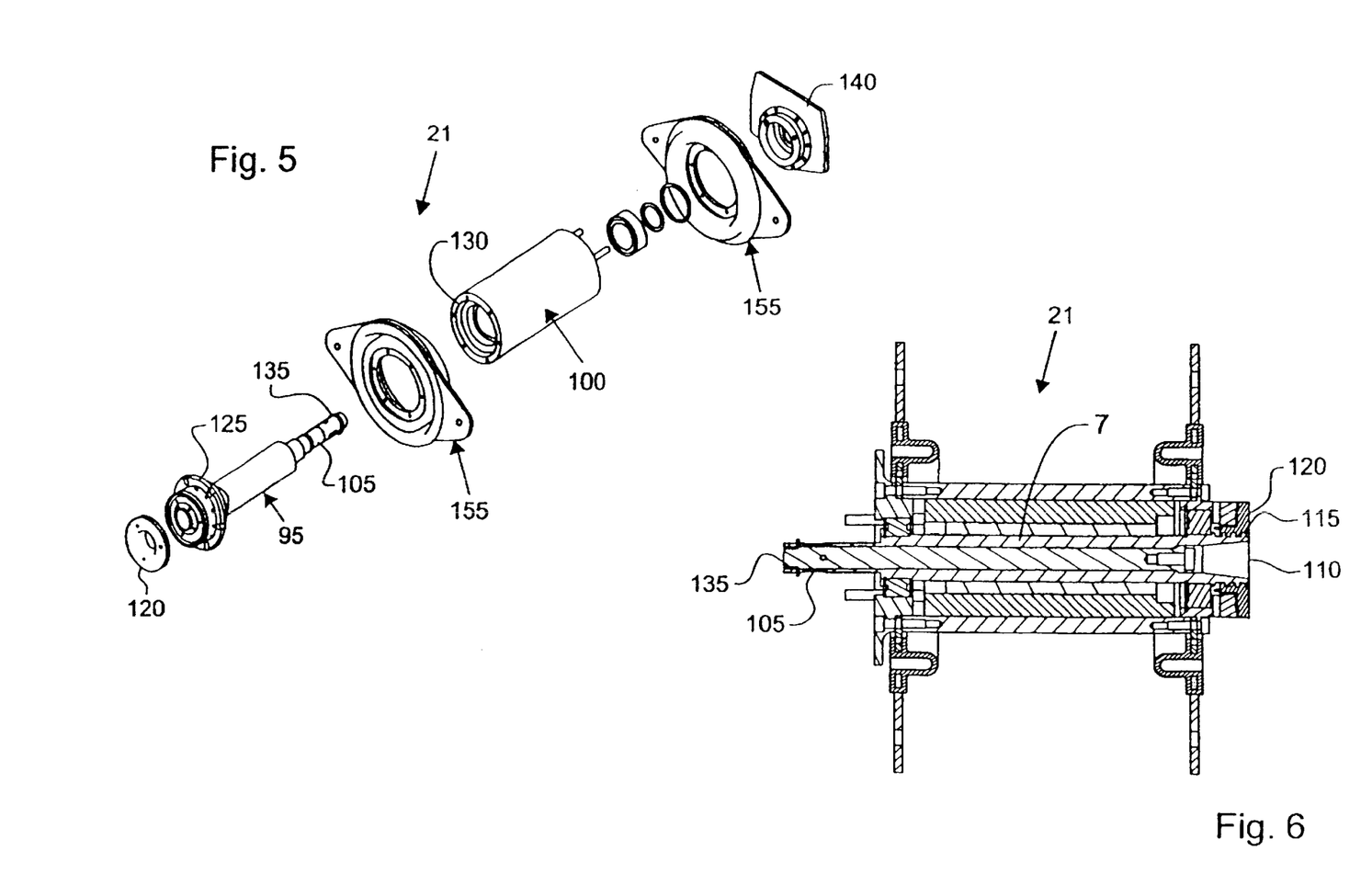
FIG. 5 is an exploded view of a motor assembly constructed in accordance with one embodiment of the present invention.
FIG. 6 is a side, cross-sectional view of a motor assembly constructed using the components of FIG. 5.

FIG. 5 illustrates an exploded view of various individual components of the motor assembly 21 while FIG. 6 illustrates a cross-sectional view of the assembled motor assembly 21. As illustrated, the motor assembly 21 comprises a motor shaft assembly 95 and a motor stator assembly 100. The motor shaft assembly 95 includes a central rotor shaft 105 having a proximal end 110 for either direct or indirect connection with the carrier rotor 15. Expulsion threads 115 are provided at an exterior surface of the rotor shaft 105 at the proximal end 110. A retaining member 120 made, for example, from stainless steel, is disposed over the proximal end of shaft 105 and seals with the otherwise exposed end portion of shaft assembly 95. The member 120 forms a close fit to the outside diameter of expulsion threads 115. Preferably, no direct contact is made between the expulsion threads 115 and member 120. The inner surface of member 120 forms a chamber with the proximal end of shaft 105. During operation, the rotational movement of shaft 105 and expulsion threads 115 urges any processing liquids proximate shaft 105 away from the motor assembly and back into the bowl 12.

Figure 7:
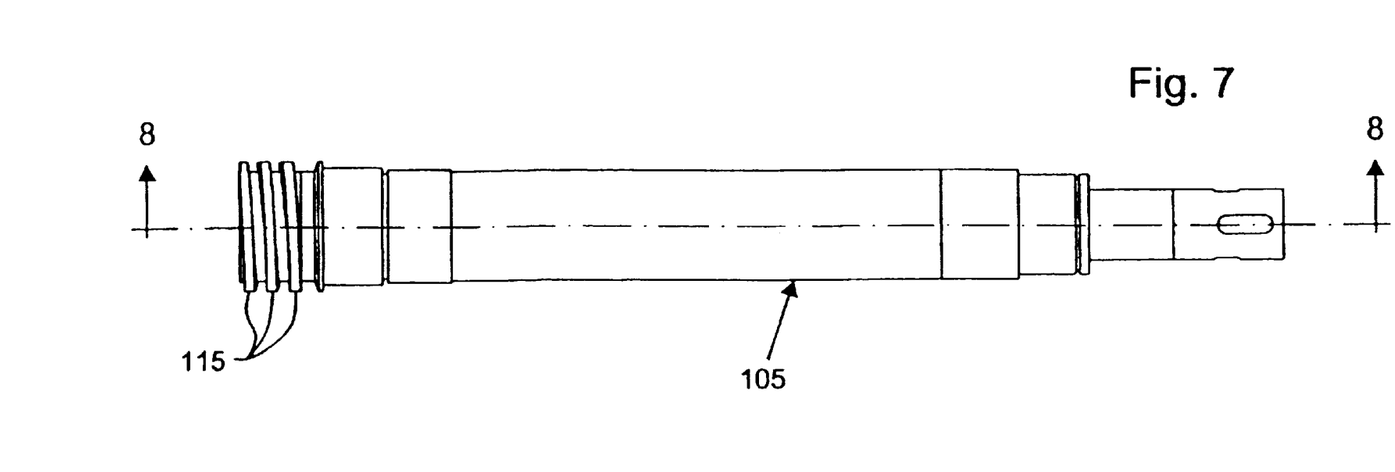
FIGS. 7 and 8 illustrate one embodiment of a rotor shaft suitable for use in the motor assembly of FIG. 6.
Figure 8:
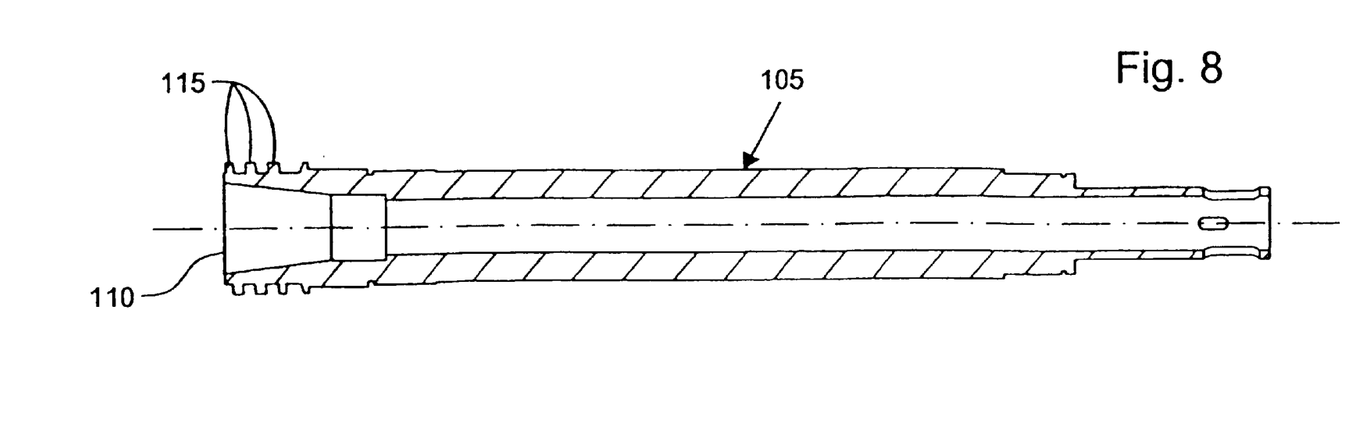

Further details concerning the particular embodiment of the central rotating shaft 105 used here are apparent from the views thereof in FIGS. 7 and 8. As illustrated, expulsion threads 115 in the form of a plurality of helical threads. Other threaded configurations may likewise be used. For example, the expulsion threads 115 may be in the form of a plurality of parallel or angled grooves.

The motor shaft assembly 95 is disposed in a central opening of stator assembly 100 and has a flange 125 at its proximal end that engages and is secured to a mounting face 130 of the stator assembly 100. The distal end 135 of the motor shaft assembly 95 extends beyond the distal. end of the stator assembly 100 to engage an end plate 140.

During operation of the apparatus 10, vibrational energy is generated. The vibrational energy may be generated external to apparatus 10 and transferred to carrier 15 and wafers 150 and, further, may be generated internally due, for example, to imbalance in the rotating members in the bowl 12. This vibrational energy may damage the wafers 150 in the carrier rotor 15 if precautions are not made to limit the transfer of this energy to the wafers 150. To this end, the motor assembly 21 is provided with shock absorbing members 155 disposed at both the proximal and distal ends of the motor assembly 21. These shock absorbing members 155, as best illustrated in FIGS. 3 and 4, are used to mount the motor assembly 21 to the frame 50 of the processing apparatus 10 thereby assisting in preventing the motor assembly 21 from transferring vibrational energy to the carrier rotor 15 and wafers 150 and, further, allowing receipt of vibrational energy from the frame 50. Such isolation limits the amount of vibrational energy that is ultimately absorbed by the carrier rotor 15 and wafers 150.

Figure 9:
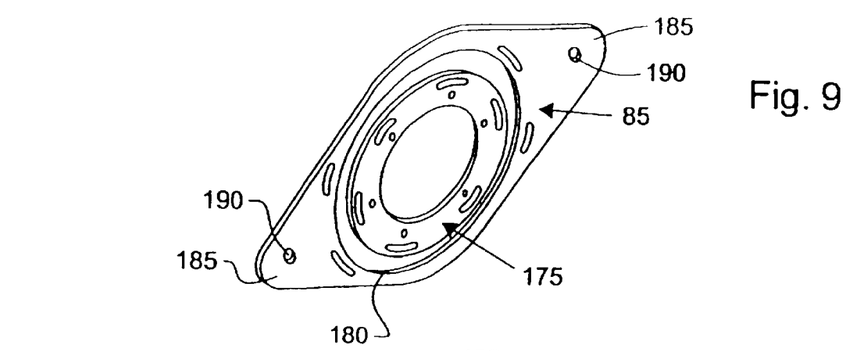
FIGS. 9–11 are various views of the shock absorbing assembly used in the embodiment of the motor assembly shown in FIGS. 5 and 6.
Figure 10:
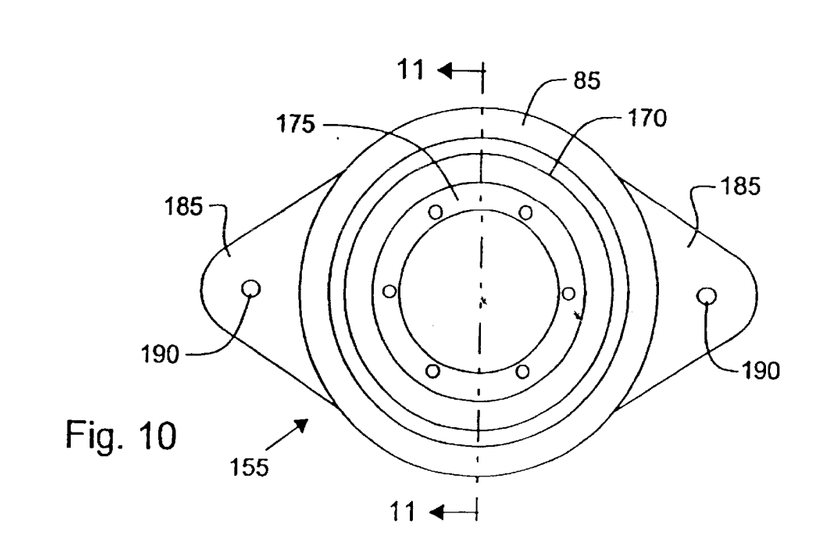
Figure 11:
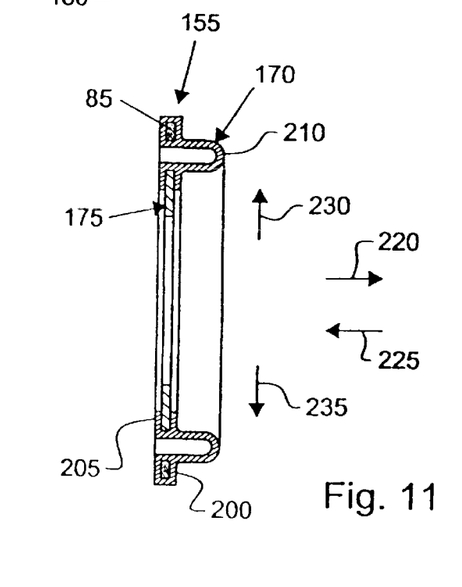

As illustrated in FIGS. 9–11, the shock absorbing members 155 are comprised of three parts: the outer flange member 85, a shock absorbing web 170, and a motor mount member 175. The outer flange member 85 includes a central aperture 180 and oppositely extending mounting ears 185. Each mounting ear 185 includes an aperture 190 for accepting a securement for securing the flange member 85 to the frame 50. The motor mount member 175 of the illustrated embodiment is generally circular in shape and has a plurality of apertures disposed about the circumference thereof to accept securements therethrough for securing the motor mount member 175 to the face of stator housing 100 and flange 125 of the shaft assembly 95. The motor mount member 175 has an outside diameter that is a predetermined degree smaller than the inside diameter of the central aperture 180 of the outer flange member 85. The difference in diameters allows the outer flange member 85 and the motor mount member 175 to be mounted concentric with one another with the shock absorbing web 170 extending about and, preferably, consuming the interstitial regions between them. In the illustrated embodiment, the shock absorbing member 155 is ultimately mounted about the stator housing 130 and shaft assembly 95 so that the centers of the apertures of both the outer flange member 85 and motor mount 175 are coincident with the axis of rotation 31 of the rotor shaft 105. It will be recognized that such shapes and the concentricity discussed here merely exemplify one embodiment of the motor assembly.

With particular reference to FIG. 11, it can be seen that the shock absorbing web 170 includes an outer peripheral lip 200 that engages and secures with the outer flange member 85 and an interior lip 205 that engages and secures with the motor mount member 175. An intermediate arched section 210 extends circumferentially about the shock absorbing web 170 in the region between the outer peripheral lip 200 and the interior lip 205. The shock absorbing web 170 is preferably made from a resilient material, such as urethane, that can absorb energy through deformation when subjected to vibrational forces and yet consistently return to its normal shape upon removal of the forces. The particular configuration illustrated here can elastically deform to some degree in directions such as 220 and 225 that are generally parallel to the axis of rotation 31 of the rotor shaft 105. However, significant elastic deformation occurs along directions, as at 230 and 235, that are generally perpendicular to the axis of rotation 31. As such, the shock absorbing web 170 effectively isolates the outer flange member 85 and frame 50 from the motor mount member 175, stator assembly 100, and shaft assembly 95 by elastically deforming in response to vibrational forces along and perpendicular to the axis of rotation 31. Such isolation reduces the amount of potentially damaging mechanical energy that ultimately reaches the wafers 150. Wafer processing yields are thus increased, thereby making use of the present invention very economical and beneficial.

In operation of the apparatus 10, semiconductor wafers in carrier 38 are placed in support members 26 of carrier rotor 15 as shown in FIG. 2. Support rod 28, as shown in FIG. 2, retains the semiconductor wafers in carrier 38 when carrier rotor 15 is revolving at relatively low RPM's. As the speed of rotation of carrier rotor 15 increases, the semiconductor wafers 150 are held in place by centrifugal force. The semiconductor wafers 150 are processed by the application of various fluids through spray members 33. Carrier rotor 15 rotates substantially around rotation axis 29. The axis of rotation of carrier rotor 15 coincides with the axis of rotation of rotor shaft 105 of the motor assembly 21. It is desirable that this angle of the axis of rotation be greater or lesser than exactly horizontal to prevent the semiconductor wafers from contacting each other during processing. If the semiconductor wafers or masks contact each other during processing, a surface tension may be formed which would prevent processing of the semiconductor wafers or masks in the area of contact resulting in a lower yield. In the preferred embodiment shown here, the angle of the axis of rotation is more or less 10 degrees above horizontal. This adds to the ease of loading of the semiconductor wafers and, as a result of the angle, carrier 38 easily slides into support members 26 without the requirement of a retaining device to prohibit carrier 38 from falling out of apparatus 10.

The high rate rotation of the semiconductor wafers by carrier rotor 15 allows the pressure of the processing fluids applied by spray members 33 to be low and therefore saving extensive costs in the elimination of high pressure equipment. Spray members 33 in the preferred embodiment separately carry the processing fluids and, further, the heated nitrogen used during drying to permit safe optimum performance.

During operation, the semiconductor wafer may be observed through optional window 18 of door 14. Apparatus 10 will not operate until door 14 is closed and locked with locking switch 42. Although not particularly pertinent to the present invention, alternative door assemblies may be used.

Various user interfaces are used to facilitate user control of parameters such as timing of various processing and rinsing steps, temperatures at which such processing steps are to take place, speeds at which the semiconductor wafers are rotated, etc. Such controls, however, are likewise not particularly pertinent to the present invention.

Figure 12:
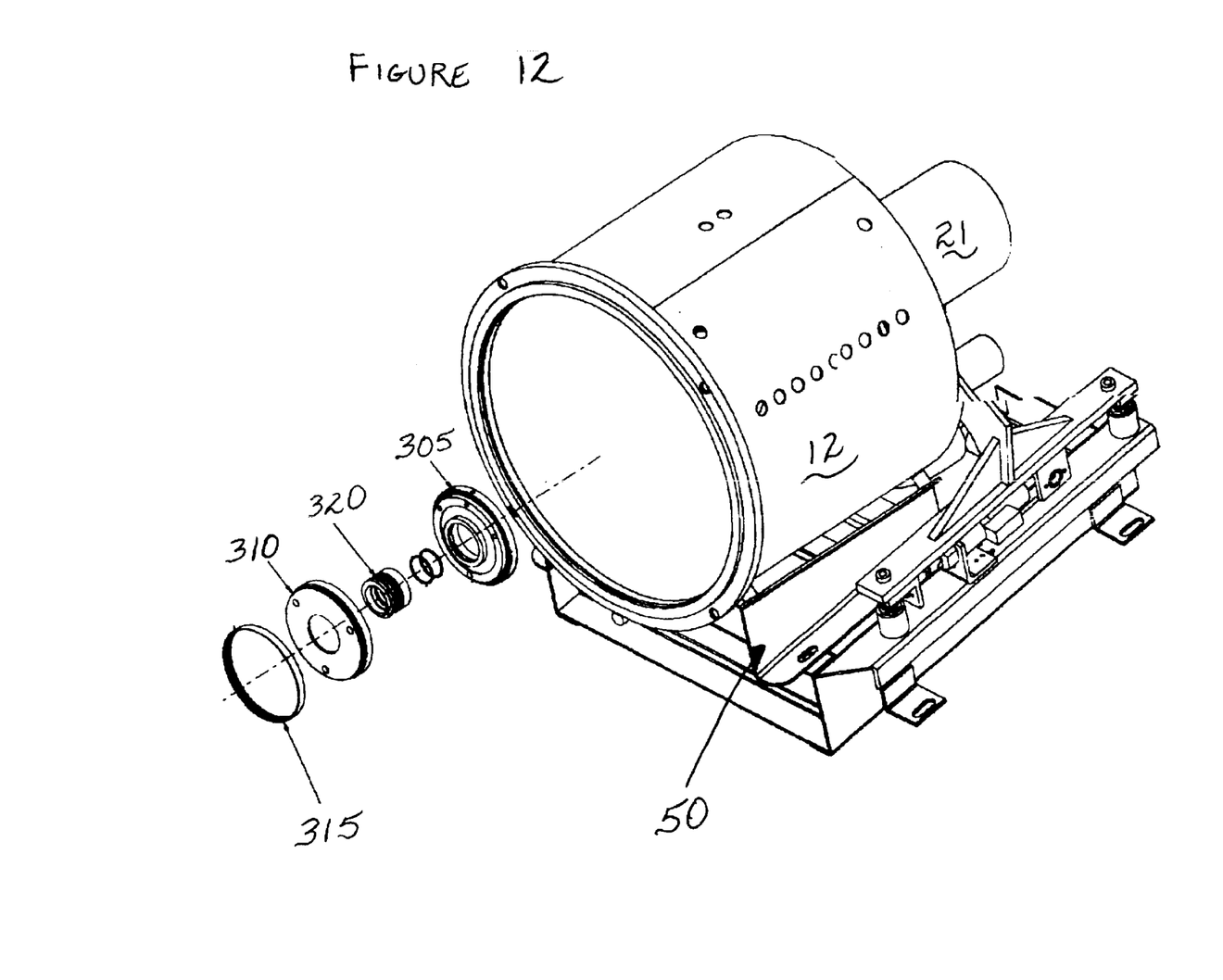
FIG. 12 is a perspective view of the components of a seal in accordance with one embodiment of the present invention.
Figure 13:
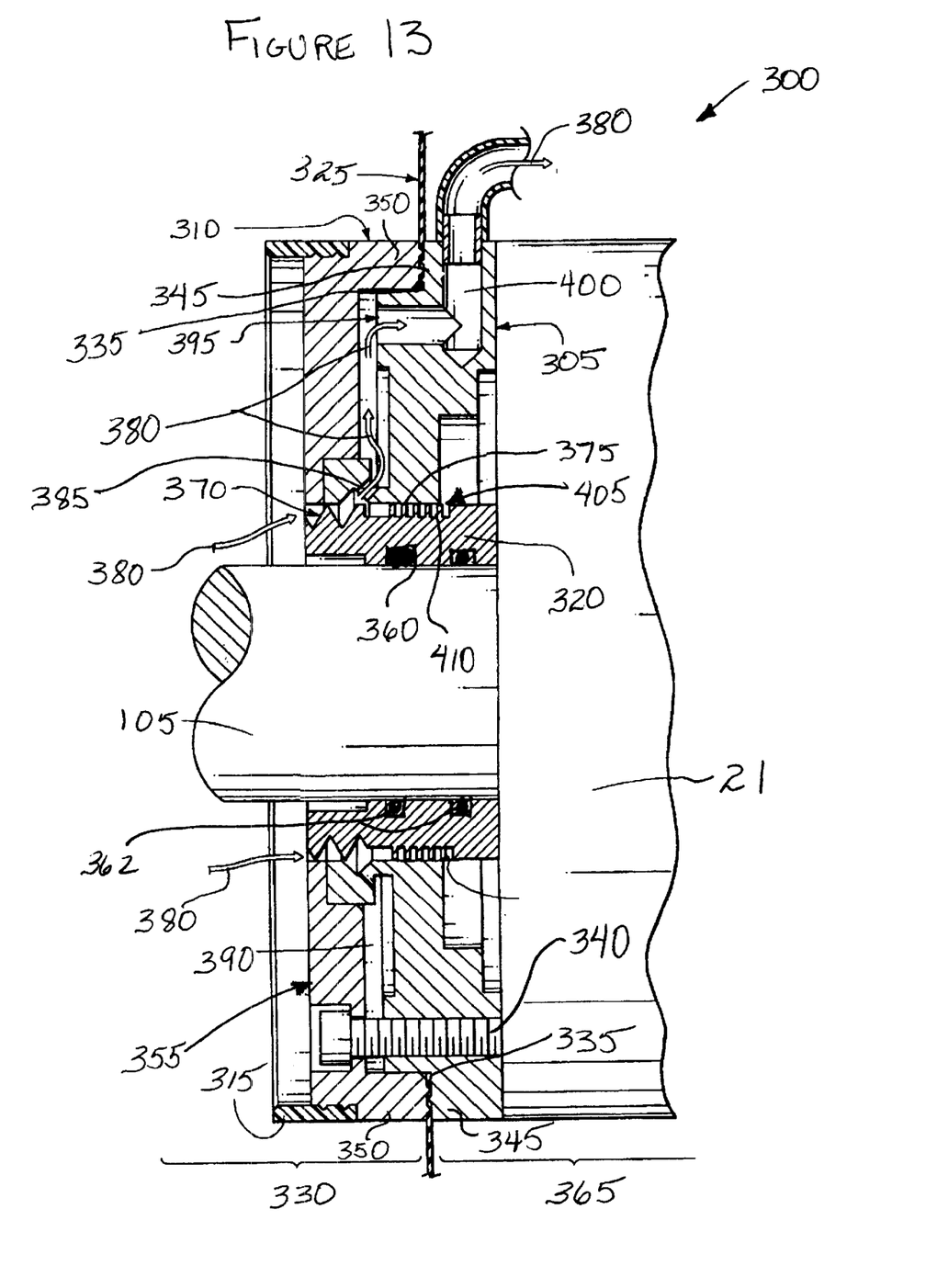
FIG. 13 is a cross-sectional view of the components of FIG. 12 as they are assembled with one another.

FIGS. 12 and 13 illustrate a further embodiment of a seal arrangement, shown generally at 300, that may be used to assist with escape of fluids, such as processing liquids and/or gases, from the proximity of the seal while concurrently protecting the motor and other components from the processing environment. As will be evident from the description below, this seal arrangement may also be used to prevent the escape of processing liquids and/or gases from the processing chamber.

Without limitation, this particular embodiment is shown as being implemented without the corresponding web shock absorbing components. Further, it is purposely shown as, but not limited to, an exemplary retrofit for use in, for example, an existing batch processor, such as an SAT® or SST® available from Semitool, Inc., of Kalispell, Mont.

Generally stated, the improved seal is comprised of four components (although not all components are necessarily required): motor adapter 305, seal retainer cap 310, ring seal 315, and seal member 320. As shown, motor adapter 305 is disposed at the exterior of a back wall boot 325 that separates the process chamber environment, shown generally at 330, from the ambient environment proximate motor 21. In the illustrated embodiment, motor adapter 305 extends through a corresponding aperture 335 disposed through the back wall boot 325 and engages seal retainer cap 310, which is disposed on the process chamber side 330 of the back wall boot 325. Seal retainer cap 310 and motor adapter 305 are secured to one another by, for example, one or more fasteners 340, etc. When secured with one another, flange 345 of motor adapter 305 and flange 350 of seal retainer cap 310 cooperate to grip the back wall boot 325 therebetween. This cooperation forms a retainer cap/motor adapter assembly, shown generally at 355, that assists in isolating the process chamber environment from the atmosphere environment along the periphery of the aperture 335.

Seal member 320 is disposed for co-rotation with motor shaft 105. In the particular embodiment illustrated here, motor shaft 105 extends through and seals with the interior walls of a central bore 360 with the assistance of one or more O-ring seals. In turn, motor shaft 105 and seal member 320 extend through a centrally disposed aperture formed in the cap/motor adapter assembly 355.

With particular reference to FIG. 13, the exterior surface of the seal member 320 is provided with a plurality of structures that assist in guiding fluids along a desired path. In the illustrated embodiment, the plurality of structures are used to effectively vent processing fluids from the process chamber side 330 of the back wall boot 325 and toward the atmospheric side 365 thereof. Although subject to modification, the particular structures used to generate this fluid flow include a plurality of flow generating threads disposed proximate the process chamber. In the illustrated embodiment, the flow generating threads are in the form of helical threads 370 that are dimensioned so that the outer periphery thereof closely conforms to the inner walls of central aperture 375 of the retainer cap/motor adapter assembly 355. It will be recognized that the helical threads may be formed alternatively as an integral structure with the shaft 105.

In operation, seal member 320 rotates along with motor shaft 105. This also causes rotation of the helical threads 370, which generate a flow of fluids, such as gases, along a fluid flow path designated by arrows 380. The illustrated fluid flow path directs the fluid flow to an exhaust or the like.

In the illustrated embodiment, it is the motor adapter 305 and seal retainer cap 310 that cooperate to define one or more fluid flow chambers that constrain the fluid flow path. More particularly, fluid driven by the rotation of the helical threads 370 is directed through one or more inlet vents 385 disposed in the motor adapter 305. The inlet vent 385 opens to an annular chamber 390 having side walls that are respectively defined by the seal retainer cap 310 and motor adapter 305. Annular chamber 390 opens to a vent passage 395 and exhaust port 400 that are disposed in fluid communication with one another in the motor adapter 305. Exhaust port 400, depending on the processing fluid employed in the process chamber, can be connected to provide the exhausted fluids to the ambient environment, a chemical containment area for subsequent disposal, or a chemical containment area for subsequent replenishment and/or recirculation.

A number of structural features at the periphery of the seal member 320 assist in ensuring that the fluid conducted by the helical threads 375 enters the inlet vent 395. For example, inlet vent 395 may be disposed to accept the fluid at an angle that corresponds with the angle of the last of the helical threads 375a. Further, fluid flow beyond the last of the helical threads 375a is inhibited by a sealing arrangement, shown generally at 405. In the illustrated embodiment, the sealing arrangement 405 is comprised of a plurality of parallel grooves 410, the outermost portions of which are in close conformity with the sidewalls of aperture 410. The sealing arrangement 405 may also be in the form of expulsion threads, such as expulsion threads 115 illustrated in FIGS. 6–8 and discussed in detail above.

Also illustrated in each of FIGS. 12 and 13 is a ring seal 315. Ring seal 315 snaps into place upon the seal retainer cap 310 and rides within a groove of carrier support 15 that, in turn, is attached to the components responsible for supporting the plurality of wafers. The wafer support components, in turn, are rotated by shaft 105. Ring seal 315 thus assists in isolating the process chamber environment from any contaminants proximate to or otherwise generated by the rotation of motor shaft 105, the rotation of sealing member 320, and/or contaminants at the interior of the motor 21. Preferably, contaminants generated at the interior of motor 21 that escape past sealing arrangement 410, if any, will be purged through exhaust port 400 along with the vented fluids.

Numerous modifications may be made to the foregoing system without departing from the basic teachings thereof. Although the present invention has been described in substantial detail with reference to one or more specific embodiments, those of skill in the art will recognize that changes may be made thereto without departing from the scope and spirit of the invention as set forth in the appended claims.

What is claimed is:

1. An apparatus for use in processing a microelectronic workpiece, the apparatus comprising:
   a processing bowl defining a processing chamber;
   a motor drive assembly connected to drive one or more components disposed in the processing chamber, the motor drive assembly comprising
      a motor,
      a shaft assembly connected to be driven by the motor about an axis of rotation, the shaft assembly having expulsion threads at an end thereof that is proximate the processing chamber; and
      a chamber forming member substantially surrounding the expulsion threads at the end of the shaft assembly proximate the processing chamber to form an expulsion chamber about at least a portion of the expulsion threads,
      rotation of the expulsion threads as the shaft assembly is driven by the motor thereby assisting in preventing foreign materials from entering the motor along the shaft assembly.

2. An apparatus as claimed in claim 1 wherein the expulsion threads are in the form of a plurality of helical threads.

3. An apparatus as claimed in claim 1 wherein the expulsion threads are in the form of a plurality of parallel grooves.

4. An apparatus as claimed in claim 1 wherein the shaft assembly is connected to drive a wafer support assembly disposed in the processing chamber.

5. An apparatus as claimed in claim 4 wherein the workpiece support assembly is adapted to support a plurality of microelectronic workpieces for batch processing in the processing chamber.

6. An apparatus for use in processing a microelectronic workpiece, the apparatus comprising:
   a processing bowl defining a processing chamber;
   a motor drive assembly connected to drive one or more components disposed in the processing chamber, the motor drive assembly comprising
      a motor;
      a shaft assembly that is connected to be rotated by the motor about an axis of rotation, the shaft assembly having flow generating threads at an end thereof that is proximate the processing chamber; and
      a chamber forming member substantially surrounding the flow generating threads at the end of the shaft assembly proximate the processing chamber to thereby form a flow chamber about at least a portion of the flow generating threads,
      rotation of the flow generating threads as the shaft assembly is driven by the motor urging a flow of fluid from the processing chamber toward an exhaust.

7. An apparatus as claimed in claim 6 wherein the shaft assembly comprises:
   a drive shaft connected to the motor; and
   a seal member disposed about a peripheral portion of the drive shaft and connected for co-rotation with the drive shaft, the seal member including
   a peripheral surface that includes the flow generating threads.

8. An apparatus as claimed in claim 6 wherein the flow generating threads are in the form of helical threads disposed at the end of the shaft assembly.

9. An apparatus as claimed in 6 wherein the chamber forming member comprises one or more fluid channels disposed to receive the flow of fluid provided by the flow generating threads.

10. An apparatus as claimed in 9 wherein the flow generating threads are in the form of helical threads and wherein the one or more fluid channels comprise an inlet vent disposed to receive the flow of fluid deflected from at least an angled surface of one of the helical threads proximate the inlet vent, the inlet vent being defined by one or more surfaces angled in general alignment with the angled surface of the one of the helical threads.

11. An apparatus as claimed in 9 wherein the one or more fluid channels comprise:
   an inlet vent disposed to receive the flow of fluid from the flow generating threads;
   an annular chamber in fluid communication with the inlet vent and disposed generally concentric with an axis of rotation of the shaft assembly; and an exhaust port in fluid communication with the annular chamber.

12. An apparatus as claimed in claim 11 wherein and further comprising:
    an annular chamber in fluid communication with the inlet vent and disposed generally concentric with an axis of rotation of the shaft assembly; and
    an exhaust port in fluid communication with the annular chamber.

13. An apparatus as claimed in claim 6 wherein the processing bowl comprises a wall boot.

14. An apparatus as claimed in claim 13 wherein the chamber forming member comprises:
    a seal retainer cap disposed on a process chamber side of the wall boot, the seal retainer cap including an aperture;
    a motor adapter secured with the seal retainer cap on a side of the wall boot opposite the process chamber side, the motor adapter including an aperture coinciding with the aperture of the seal retainer cap, the coinciding apertures being defined by surfaces that form the chamber about the flow generating threads, the motor adapter and the seal retainer cap gripping the boot wall.

15. An apparatus as claimed in claim 14 wherein the seal retainer cap and the motor adapter cooperate to form one or more fluid channels that conduct the flow of fluid provided by the flow generating threads to the exhaust.

16. An apparatus as claimed in claim 6 wherein fluid conducted to the exhaust is exhausted to ambient atmosphere.

17. An apparatus as claimed in claim 6 wherein fluid conducted to the exhaust is exhausted to a containment vessel.

18. An apparatus as claimed in claim 6 wherein fluid conducted to the exhaust is exhausted to a recirculation system.

19. An apparatus for use in processing a microelectronic workpiece, the apparatus comprising:
    a processing bowl defining a processing chamber;
    a motor drive assembly connected to drive one or more components disposed in the processing chamber, the motor drive assembly comprising
    a motor;
    a shaft assembly that is connected to be rotated by the motor about an axis of rotation, the shaft assembly having flow generating threads and seal threads at an end of the shaft assembly that is proximate the processing chamber, the flow generating threads being disposed further from the motor than are the seal threads; and
    a chamber forming member substantially surrounding the flow generating threads and the seal threads to thereby form a flow chamber about at least a portion of the flow generating threads and about at least a portion of the seal threads,
    rotation of the flow generating threads as the shaft assembly is driven by the motor urging a flow of fluid from the processing chamber to an outlet, concurrent rotation of the seal threads assisting in preventing the fluid flow from entering the motor.

20. An apparatus as claimed in claim 19 wherein the seal threads are in the form of a plurality of helical threads.

21. An apparatus as claimed in claim 19 wherein the seal threads are in the form of a plurality of parallel grooves.

22. An apparatus as claimed in claim 19 wherein the shaft assembly comprises:
    a drive shaft connected to the motor; and
    a seal member disposed about a peripheral portion of the drive shaft and connected for co-rotation with the drive shaft, the seal member including a peripheral surface that includes the flow generating threads.

23. An apparatus as claimed in claim 19 wherein the flow generating threads are in the form of helical threads disposed at the end of the shaft assembly.

24. An apparatus as claimed in claim 19 wherein the chamber forming member comprises one or more fluid channels disposed to receive the flow of fluid provided by the flow generating threads.

25. An apparatus as claimed in 24 wherein the flow generating threads are in the form of helical threads and wherein the one or more fluide channels comprise an inlet vent disposed to receive the flow of fluid as the fluid is deflected from an angled surface of one of the helical threads proximate the inlet vent, the inlet vent being defined by one or more surfaces angled in general alignment with the angled surface of the one of the helical threads.

26. An apparatus as claimed in claim 25 wherein and further comprising:
    an annular chamber in fluid communication with the inlet vent and disposed generally concentric with an axis of rotation of the shaft assembly; and
    an exhaust port in fluid communication with the annular chamber.

27. An apparatus as claimed in 24 wherein the one or more fluid channels comprise:
    an inlet vent disposed to receive the flow of fluid from the flow generating threads;
    an annular chamber in fluid communication with the inlet vent and disposed generally concentric with an axis of rotation of the shaft assembly; and
    an exhaust port in fluid communication with the annular chamber.

28. An apparatus as claimed in claim 19 wherein the processing bowl comprises a wall boot.

29. An apparatus as claimed in claim 28 wherein the chamber forming member comprises:
    a seal retainer cap disposed on a process chamber side of the wall boot, the seal retainer cap including an aperture;
    a motor adapter secured with the seal retainer cap on a side of the wall boot opposite the process chamber side, the motor adapter including an aperture coinciding with the aperture of the seal retainer cap, the coinciding apertures being defined by surfaces that form the chamber about the flow generating threads, the motor adapter and the seal retainer cap gripping the boot wall.

30. An apparatus as claimed in claim 29 wherein the seal retainer cap and the motor adapter cooperate to form one or more fluid channels that conduct the flow of fluid provided by the flow generating threads to an exhaust.

31. An apparatus as claimed in claim 30 wherein fluid conducted to the exhaust is exhausted to ambient atmosphere.

32. An apparatus as claimed in claim 30 wherein fluid conducted to the exhaust is exhausted to a containment vessel.

33. An apparatus as claimed in claim 30 wherein fluid conducted to the exhaust is exhausted to a recirculation system.

* * * * *